(12) United States Patent
Horning et al.

(10) Patent No.: US 9,171,964 B2
(45) Date of Patent: Oct. 27, 2015

(54) SYSTEMS AND METHODS FOR A THREE-LAYER CHIP-SCALE MEMS DEVICE

(75) Inventors: Robert D. Horning, Savage, MN (US); Ryan Supino, Loretto, MN (US)

(73) Assignee: Honeywell International Inc., Morristown, NJ (US)

( * ) Notice: Subject to any disclaimer, the term of this patent is extended or adjusted under 35 U.S.C. 154(b) by 838 days.

(21) Appl. No.: 13/296,642

(22) Filed: Nov. 15, 2011

(65) Prior Publication Data

US 2012/0126349 A1 May 24, 2012

Related U.S. Application Data

(60) Provisional application No. 61/416,485, filed on Nov. 23, 2010.

(51) Int. Cl.
*H01L 29/84* (2006.01)
*B81B 7/00* (2006.01)

(52) U.S. Cl.
CPC .............. *H01L 29/84* (2013.01); *B81B 7/0032* (2013.01); *B81B 7/0038* (2013.01); *B81B 7/0074* (2013.01); *B81B 7/0077* (2013.01); *B81B 2201/025* (2013.01); *B81B 2201/0235* (2013.01); *B81B 2201/0242* (2013.01); *B81C 2201/019* (2013.01)

(58) Field of Classification Search
CPC .... H01L 29/84; B81B 7/0032; B81B 7/0074; B81B 7/0077
See application file for complete search history.

(56) References Cited

U.S. PATENT DOCUMENTS

| | | | |
|---|---|---|---|
| 5,397,747 A | 3/1995 | Angiulli et al. | |
| 5,497,660 A | 3/1996 | Warren | |
| 5,600,541 A * | 2/1997 | Bone et al. | 361/707 |
| 5,786,744 A | 7/1998 | Nishio et al. | |
| 5,880,011 A | 3/1999 | Zablotny et al. | |
| 5,892,153 A | 4/1999 | Weinberg et al. | |
| 5,914,553 A | 6/1999 | Adams et al. | |
| 5,952,574 A | 9/1999 | Weinberg et al. | |
| 5,969,848 A | 10/1999 | Lee et al. | |
| 5,986,381 A | 11/1999 | Hoen et al. | |
| 6,000,280 A | 12/1999 | Miller et al. | |
| 6,181,050 B1 | 1/2001 | Taussig et al. | |
| 6,391,673 B1 | 5/2002 | Ha et al. | |

(Continued)

FOREIGN PATENT DOCUMENTS

| | | |
|---|---|---|
| EP | 1998371 | 3/2008 |
| WO | 03050889 | 6/2003 |

OTHER PUBLICATIONS

European Patent Office, "Communication under Rule 71(3) from EP Application No. 11190202.9 ", "from EP Counterpart of U.S. Pat. No. 8,748,206", Jun. 12, 2014, Published in: EP.

(Continued)

*Primary Examiner* — Joseph C Nicely
(74) *Attorney, Agent, or Firm* — Fogg & Powers LLC

(57) ABSTRACT

Systems and methods for a micro-electromechanical system (MEMS) device are provided. In one embodiment, a system comprises a first outer layer and a first device layer comprising a first set of MEMS devices, wherein the first device layer is bonded to the first outer layer. The system also comprises a second outer layer and a second device layer comprising a second set of MEMS devices, wherein the second device layer is bonded to the second outer layer. Further, the system comprises a central layer having a first side and a second side opposite that of the first side, wherein the first side is bonded to the first device layer and the second side is bonded to the second device layer.

11 Claims, 9 Drawing Sheets

(56) References Cited

U.S. PATENT DOCUMENTS

| | | |
|---|---|---|
| 6,481,284 B2 | 11/2002 | Geen et al. |
| 6,489,670 B1 * | 12/2002 | Peterson et al. ............ 257/686 |
| 6,612,029 B2 | 9/2003 | Behin et al. |
| 6,725,719 B2 | 4/2004 | Cardarelli |
| 6,743,696 B2 | 6/2004 | Jeung et al. |
| 6,744,173 B2 | 6/2004 | Behin et al. |
| 6,744,174 B2 | 6/2004 | Paden et al. |
| 6,757,092 B2 | 6/2004 | Abu-Ageel |
| 6,792,804 B2 | 9/2004 | Adams et al. |
| 6,845,668 B2 | 1/2005 | Kim et al. |
| 6,853,067 B1 | 2/2005 | Cohn et al. |
| 6,865,944 B2 | 3/2005 | Glenn et al. |
| 6,868,726 B2 | 3/2005 | Lemkin et al. |
| 6,949,807 B2 | 9/2005 | Eskridge et al. |
| 7,004,025 B2 * | 2/2006 | Tamura ............................ 73/511 |
| 7,036,373 B2 | 5/2006 | Johnson et al. |
| 7,040,922 B2 | 5/2006 | Harney et al. |
| 7,074,636 B2 | 7/2006 | Curtis et al. |
| 7,104,129 B2 | 9/2006 | Nasiri et al. |
| 7,258,010 B2 | 8/2007 | Horning et al. |
| 7,258,011 B2 | 8/2007 | Nasiri et al. |
| 7,357,874 B2 | 4/2008 | Moffat et al. |
| 7,444,868 B2 | 11/2008 | Johnson |
| 7,469,588 B2 | 12/2008 | LaFond et al. |
| 7,504,757 B2 | 3/2009 | Subramanian et al. |
| 7,526,402 B2 | 4/2009 | Tanenhaus et al. |
| 7,527,997 B2 | 5/2009 | Xu et al. |
| 7,585,750 B2 | 9/2009 | Do et al. |
| 7,690,254 B2 | 4/2010 | Pilchowski et al. |
| 7,700,410 B2 | 4/2010 | Bernstein et al. |
| 7,741,156 B2 | 6/2010 | Pagaila et al. |
| 7,776,655 B2 | 8/2010 | Do et al. |
| 7,818,871 B2 | 10/2010 | Shcheglov |
| 7,820,484 B2 | 10/2010 | Chua et al. |
| 7,849,742 B2 | 12/2010 | Wang et al. |
| 7,872,394 B1 | 1/2011 | Gritters et al. |
| 7,932,570 B1 | 4/2011 | Eskridge |
| 7,984,648 B2 | 7/2011 | Horning et al. |
| 8,011,247 B2 | 9/2011 | Glenn |
| 8,047,075 B2 | 11/2011 | Nasiri et al. |
| 8,187,902 B2 | 5/2012 | Weinberg et al. |
| 8,250,921 B2 | 8/2012 | Nasiri et al. |
| 8,508,039 B1 | 8/2013 | Nasiri et al. |
| 8,549,922 B2 | 10/2013 | Kalnitsky et al. |
| 2002/0109133 A1 | 8/2002 | Hikita et al. |
| 2003/0005767 A1 | 1/2003 | Hulsing, II |
| 2003/0085438 A1 | 5/2003 | Habibi et al. |
| 2003/0106372 A1 | 6/2003 | Adams et al. |
| 2003/0183008 A1 | 10/2003 | Bang et al. |
| 2003/0196490 A1 * | 10/2003 | Cardarelli ............... 73/504.02 |
| 2004/0221451 A1 * | 11/2004 | Chia et al. .................... 29/854 |
| 2005/0023629 A1 | 2/2005 | Ding et al. |
| 2005/0170656 A1 | 8/2005 | Nasiri et al. |
| 2005/0218488 A1 | 10/2005 | Matsuo |
| 2005/0284222 A1 | 12/2005 | Johnson et al. |
| 2006/0063462 A1 | 3/2006 | Ding et al. |
| 2006/0179942 A1 | 8/2006 | Fukaura et al. |
| 2006/0219006 A1 | 10/2006 | Nasiri et al. |
| 2007/0090475 A1 | 4/2007 | Karnick et al. |
| 2007/0096295 A1 | 5/2007 | Burtzlaff et al. |
| 2007/0114643 A1 | 5/2007 | DCamp et al. |
| 2007/0158807 A1 | 7/2007 | Lu et al. |
| 2008/0049386 A1 * | 2/2008 | Pornin et al. ................ 361/679 |
| 2008/0115579 A1 | 5/2008 | Seeger et al. |
| 2009/0001565 A1 | 1/2009 | Takemoto et al. |
| 2009/0065907 A1 | 3/2009 | Haba et al. |
| 2009/0294914 A1 | 12/2009 | Pagaila et al. |
| 2009/0309203 A1 | 12/2009 | Seppala et al. |
| 2010/0072626 A1 * | 3/2010 | Theuss et al. ................ 257/774 |
| 2010/0123241 A1 | 5/2010 | Shi et al. |
| 2010/0251818 A1 | 10/2010 | Ge et al. |
| 2010/0270668 A1 | 10/2010 | Marcoux |
| 2010/0320595 A1 | 12/2010 | Horning et al. |
| 2011/0163955 A1 | 7/2011 | Nasiri et al. |
| 2011/0227173 A1 | 9/2011 | Seppala et al. |
| 2012/0112293 A1 | 5/2012 | Pornin et al. |
| 2012/0126348 A1 | 5/2012 | Horning |
| 2012/0126350 A1 | 5/2012 | Horning |
| 2012/0126881 A1 | 5/2012 | Horning et al. |
| 2012/0130672 A1 | 5/2012 | Horning et al. |
| 2013/0087933 A1 | 4/2013 | Pornin et al. |

OTHER PUBLICATIONS

European Patent Office, "European Search Report", "from EP Counterpart of U.S. Appl. No. 13/301,145", Jun. 16, 2014, Published in: EP.

Lakdawala, Hasnain et al. , "Temperature Control of CMOS Micromachined Sensors", 2002, pp. 324-327, Publisher: IEEE Internatinal Micro Electro Mechanical Systems Conference, Published in: New York, NY.

European Patent Office, "Office Action from EP Application No. 11190201.1 mailed Jul. 11, 2014", "from Foreign Counterpart of U.S. Appl. No. 13/301,145", Jul. 11, 2014, pp. 1-4, Published in: EP.

European Patent Office, "Office Action", "from Foreign Counterpart of U.S. Appl. No. 13/299,576", Apr. 11, 2012, pp. 1-5, Published in: EP.

European Patent Office, "European Search Report", "from Foreign Counterpart of U.S. Appl. No. 13/299,576", Mar. 1, 2012, pp. 1-3, Published in: EP.

U.S. Patent and Trademark Office, "Office Action", "from U.S. Appl. No. 13/299,576", Mar. 18, 2013, p. 1-20, Published in: US.

U.S. Patent and Trademark Office, "Office Action ", "from U.S. Appl. No. 13/301,145", Oct. 29, 2013, p. 1-18, Published in: US.

Leib, Jurgen et al, "Novel Hermetic Wafer-Level-Packaging Technology Using Low-Temperature Passivation", "2005 Electronic Components and Technology Conference", 2005, pp. 562-565, Publisher: IEEE.

Leib et al, "New Wafer-Level-Packaging Technology using Silicon-Via-Contacts for Optical and Other Sensor Applications", "2004 Electronic Components and Technology Conference", Jun. 1, 2004, pp. 843-847, vol. 1, Publisher: IEEE.

European Patent Office, "European Search Report", "from Foreign Counterpart of U.S. Appl. No. 13/295,273", Dec. 4, 2013, pp. 1-3, Published in: EP.

European Patent Office, "European Search Report", "from Foreign Counterpart of U.S. Appl. No. 13/296,642", Dec. 4, 2013, pp. 1-3, Published in: EP.

Molfese et al, "Analysis, testing and optimisation of electrostatic comb-drive levitational actuators", "Analog Integr Circ Sig Process", Dec. 22, 2005, pp. 33-40, No. 48, Publisher: Springer Science + Business Media, LLC, Published in: Pisa, Italy.

Painter et al, "Effect of Levitation Forces on the Performance of Surface Micromachined MEMS Gyroscopes", Oct. 24, 2004, pp. 508-511, vol. 1, Publisher: IEEE.

Tang et al, "Electrostatic Comb Drive Levitation and Control Method", "Journal of Microelectromechanical Systems", Dec. 1992, pp. 170-178, vol. 1, No. 4, Publisher: IEEE.

Tang et al, "Electrostatically Balanced Comb Drive for Controlled Levitation", "Solid-State Sensor and Actuator Workshop 4th Technical Digest", Jun. 1990, pp. 23-27, Publisher: IEEE.

Timpe et al., "Levitation compensation method for dynamic electrostatic comb-drive actuators", "Science Direct Sensors and Actuators A.", Feb. 7, 2008, pp. 383-389, No. 143, Publisher: Elsevier.

U.S. Patent and Trademark Office, "Notice of Allowance", "from U.S. Appl. No. 13/295,273", Apr. 14, 2014, pp. 1-17, Published in: US.

U.S. Patent and Trademark Office, "Notice of Allowance", "from U.S. Appl. No. 13/301,145", Apr. 28, 2014, pp. 1-7, Published in: US.

U.S. Patent and Trademark Office, "Office Action", "from U.S. Appl. No. 13/295,273", Dec. 24, 2013, p. 1-40, Published in: US.

European Patent Office, "Communication under Rule 71(3) from EP Application No. 11190203.7 mailed Feb. 18, 2014", "from Foreign Counterpart of U.S. Appl. No. 13/296,642", Feb. 18, 2014, pp. 1-7, Published in: EP.

U.S. Patent and Trademark Office, "Final Office Action", "From U.S. Appl. No. 13/301,145", Feb. 24, 2014, pp. 1-7, Published in: US.

Chinese Patent Office, "First Office Action for CN Application No. 201110462085.1", "from Foreign Counterpart to U.S. Appl. No. 13/296,642", Apr. 3, 2015, pp. 1-18, Published in: CN.

* cited by examiner

SYSTEMS AND METHODS FOR A THREE-LAYER CHIP-SCALE MEMS DEVICE

CROSS REFERENCE TO RELATED APPLICATIONS

This application claims the benefit of priority to U.S. Provisional Application No. 61/416,485, filed on Nov. 23, 2010, the disclosure of which is incorporated herein by reference.

BACKGROUND

Inertial measurement units (IMUs) can acquire motion information for determining navigational information like position, heading, and attitude. For example, IMUs are used in high performance applications such as vehicle or air plane navigation, and lower performance applications such as aircraft attitude and heading recognition, personal navigation, or missile guidance. In some applications that incorporate IMUs there is limited space for the placement of an IMU. As a typical IMU provides motion information by using three gyroscopes, three accelerometers, and supporting electrodes and interconnects, it is challenging to integrate an IMU into applications with limited space while maintaining desired performance.

SUMMARY

The embodiments of the present invention provide systems and methods for a three-layer chip scale MEMS device and will be understood by reading and studying the following specification.

Systems and methods for a micro-electromechanical system (MEMS) device are provided. In one embodiment, a system comprises a first outer layer and a first device layer comprising a first set of MEMS devices, wherein the first device layer is bonded to the first outer layer. The system also comprises a second outer layer and a second device layer comprising a second set of MEMS devices, wherein the second device layer is bonded to the second outer layer. Further, the system comprises a central layer having a first side and a second side opposite that of the first side, wherein the first side is bonded to the first device layer and the second side is bonded to the second device layer.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
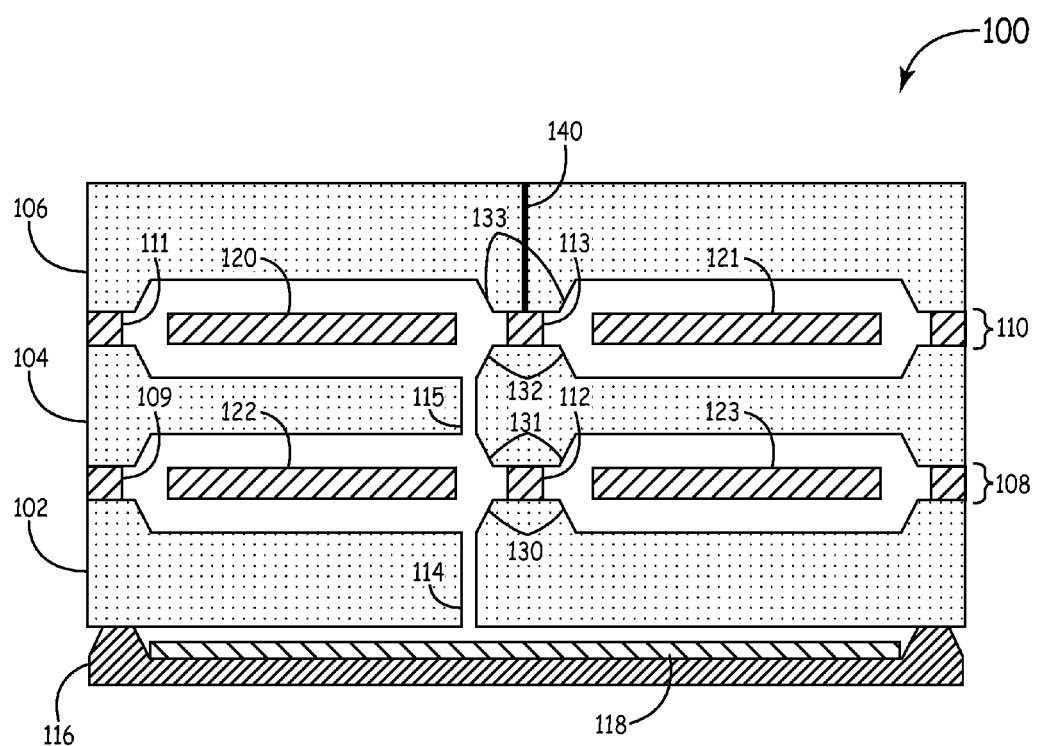
FIG. 1 is a diagram of a three-layer chip-scale MEMS device according to one embodiment.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the methods presented in the drawing figures and the specification are not to be construed as limiting the order in which the individual steps may be performed. The following detailed description is, therefore, not to be taken in a limiting sense.

Embodiments of the present disclosure provide systems and methods for fabricating a small IMU that preserves high performance. To consolidate the multiple components and electronics of an IMU, micro-electromechanical systems (MEMS) gyroscopes and accelerometers are sealed between three different layers of supportive glass. The placement of the MEMS gyroscopes and accelerometers between the three glass wafers allows for the reduction of volume occupied by the IMU while preserving desired performance.

FIG. 1 is a diagram of one embodiment of a three-layer chip-scale MEMS system 100. MEMS system 100 includes three stacked layers that enclose multiple MEMS devices. For example, the three stacked layers of MEMS system 100 include a first outer layer 102, a second outer layer 106, and a central layer 104, which enclose a first device layer 108 and a second device layer 110. The stacked orientation of first outer layer 102, second outer layer 106, and central layer 104 decrease the ratio of area to thickness of the MEMS system 100, which increases the rigidity of MEMS system 100. The increase in rigidity can reduce strains which can degrade the performance of MEMS devices that are susceptible to errors induced by external shock, vibrations, or thermal expansion mismatches between the MEMS system and surrounding materials. To further increase rigidity, first outer layer 102, second outer layer 106, and central layer 104 are made from a rigid material such as glass, or other rigid nonconductive material.

In certain embodiments, first outer layer 102, second outer layer 106, and central layer 104 include recesses and support electrodes and interconnects to support the operation of MEMS devices. For example, the inward facing surface of first outer layer 102 has recesses 130 and electrodes and interconnects formed therein to support the operation of first device layer 108. Also, the inward facing surface of second outer layer 106 has recesses 133 and electrodes and interconnects formed therein to support the operation of second device layer 110. The surface of central layer 104 that faces first outer layer 102 has recesses 131 and metal interconnects formed therein to support the operation of first device layer 108. Further, the surface of central layer 104 that faces second outer layer 106 has recesses 132 and electrodes and interconnects formed therein to support the operation of second device layer 110.

In further embodiments, MEMS system 100 is an inertial sensor assembly (ISA) in an inertial measurement unit (IMU). When the MEMS system 100 is an ISA, MEMS system 100 includes accelerometers and gyroscopes to sense rotation and acceleration of the MEMS system 100. In some implementations, MEMS system includes three accelerometers that sense acceleration along three orthogonal axes and three gyroscopes that sense rotation about three orthogonal axes. First device layer 108 and second device layer 110 when combined contain three accelerometers and three gyroscopes. Thus, in one embodiment, first device layer 108 includes a first set of gyroscopes 122 and a first set of accelerometers 123 and second device layer 110 includes a second set of gyroscopes 120 and a second set of accelerometers 121.

Certain MEMS devices are designed to operate in different atmosphere types. For example, first and second sets of gyroscopes 120, 122 are designed to operate in a vacuum atmosphere type while first and second sets of accelerometers 121, 123 operate in a gaseous atmosphere type. When first device layer 108 and second device layer 110 contain different MEMS devices that operate in different atmosphere types, first device layer 108 includes a seal 112 and second device layer 110 includes a seal 113 that hermetically isolates the different devices from each other within a device layer. Further, to hermetically isolate the MEMS devices from the air in an external environment, first device layer 108 includes an external seal 109 and second device layer 110 includes an external seal 111.

In at least one embodiment, MEMS system 100 includes a getter 118 to preserve a vacuum environment for at least a portion of the MEMS devices in first device layer 108 and second device layer 110. In some implementations, getter 118 is located in a recess in either outer layers 102, 106, or central layer 104, where getter 118 is in a continuous air cavity with first and second sets of gyroscopes 120, 122. In an alternative embodiment, a channel 114 is located in first outer layer 102 and a channel 115 is located in central layer 104, such that channels 114 and 115 in conjunction with the recessed areas enclosing first and second set of gyroscopes 120, 122 form a continuous air cavity, such that getter 118 is able to preserve the vacuum for the MEMS devices enclosed by the continuous air cavity.

In certain embodiments, a sealing layer 116 is attached to an external surface of MEMS system 100 to prevent the exchange of atmosphere types between an enclosed volume in MEMS system 100 and the external environment. In one implementation, sealing layer 116 also contains getter 118 which is exposed to the continuous air cavity that encloses first and second sets of gyroscopes 120 and 122 through channels 114 and 115. Thus, sealing layer 116 in conjunction with getter 118 seals and preserves a vacuum in MEMS system 100. Further, MEMS system 100 includes alternative electrical devices in sealing layer 116. In certain embodiments, sealing layer 116 is a silicon layer bonded to an outer layer and provides a surface to mount MEMS system 100 to another device or surface such as a printed circuit board.

In a further exemplary embodiment, MEMS system 100 includes a via connection 140 that allows electronic connections to the device layers. In one implementation, via connection 140 is formed by creating a hole through an outer layer by drilling or microabrasion. The hole is formed into a portion of a device layer, when via connection 140 is connected to the portion of the device layer, the hole is filled with conductive material to provide an electrical connection between the outer layer and electrodes and metal interconnects.

An ISA formed as described above in relation to MEMS system 100 provides an ISA that is both small and robust. For example, getter 116 is deposited in an unused portion of sealing layer 116 rather than in the recesses containing the MEMS devices, which allows efficient gettering without increasing the size of MEMS system 100. Also, the individual layers can each be made thinner without sacrificing chip stiffness because the small ratio of area to thickness makes the stacked ISA a much stiffer chip and less sensitive to performance-degrading strains and temperature variations.

Figure 2:
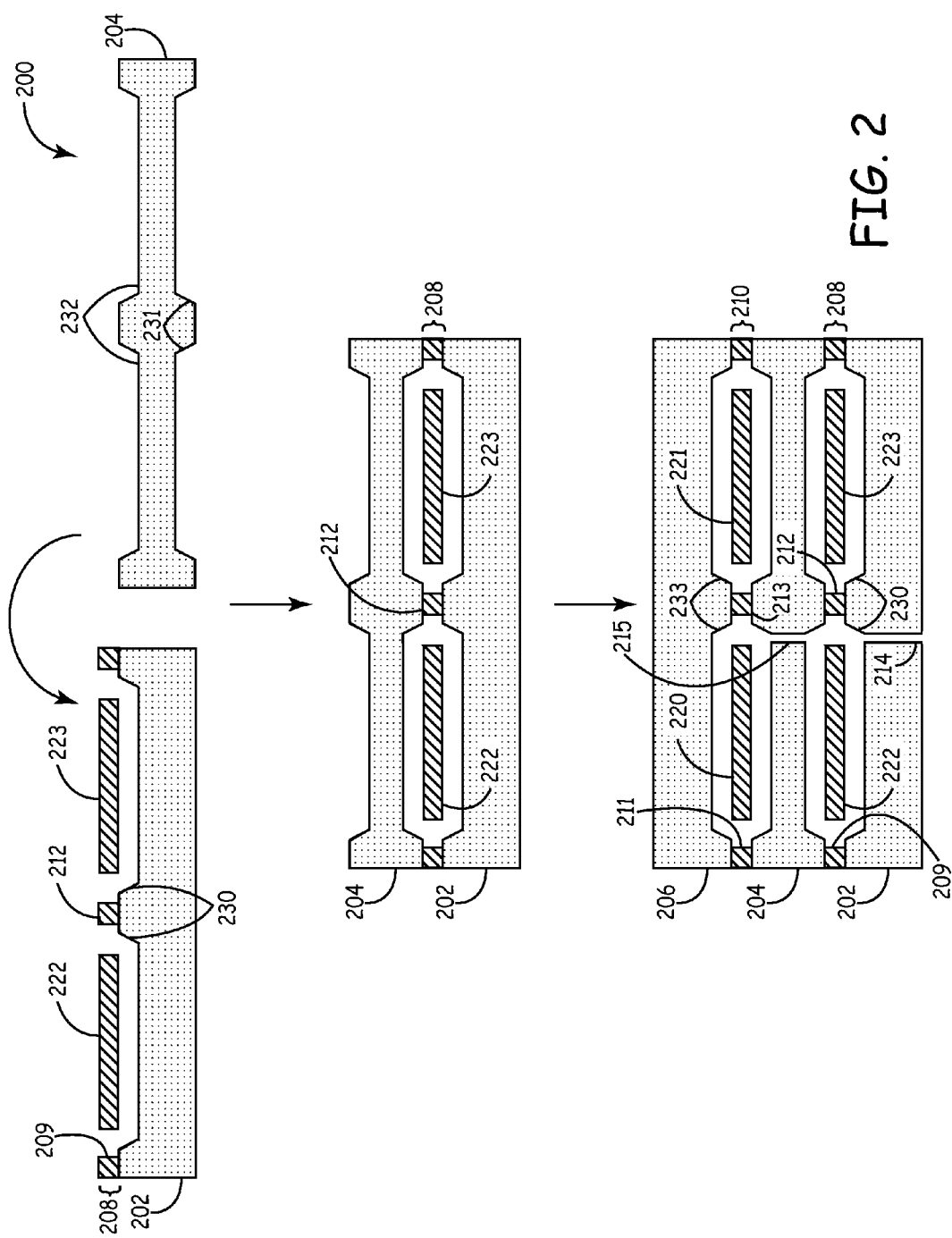
FIG. 2 is a diagram illustrating the fabrication of a three-layer chip-scale MEMS device according to one embodiment.

FIG. 2 is a diagram that illustrates a fabrication process 200 for a three-layer chip-scale MEMS device according to one embodiment. As discussed above, in relation to FIG. 1, MEMS system 100 includes a first outer layer 102. First outer layer 102 is similar to first outer layer 202 shown in FIG. 2. Fabrication process 200 creates first outer layer 202 by etching recesses 230 in a glass wafer and then patterning electrodes and interconnect metal onto the recessed area for supporting the operation of MEMS devices. Further, fabrication process 200 fabricates a central layer 204, which is similar to central layer 104 described in FIG. 1. Fabrication process 200 forms central layer 204 differently from first outer layer 202 in that fabrication process 200 forms recesses 231, 232 and supporting electrodes and interconnect metal on two opposite surfaces of central layer 204 as compared to the formation of recesses and electrodes and interconnects on a single surface as performed with first outer layer 202.

The fabrication process 200 also forms a first device layer 208. First device layer 208 is similar to first device layer 108 in FIG. 1 and fabrication process 200 forms first device layer 208 using normal MEMS processes. For example, fabrication process 200 deposits an epitaxial layer on a supportive silicon substrate. Process 200 then patterns the MEMS devices 222, 223 and seals 212 and 209 of first device layer 208 into the epitaxial layer. When the epitaxial layer is patterned, process 200 bonds the epitaxial layer containing first device layer 208 to first outer layer 202. In some implementations, process 200 bonds first outer layer 202 to the epitaxial layer containing first device layer 208 using anodic bonding. When the epitaxial layer is bonded to first outer layer 202, process 200 removes the supportive silicon substrate from the epitaxial layer. When the supportive silicon substrate is removed, MEMS devices 222, and 223 in first outer layer 208 become free to move while being anchored to first outer layer 202.

When fabrication process 200 bonds first device layer 208 to first outer layer 202, process 200 also bonds central layer 204 to first device layer 208. In some implementations, process 200 forms recesses 231, 232 and patterns electrodes and interconnects in both sides of central layer 204 before bonding central layer 204 to first device layer 208. Alternatively, process 200 forms recesses 231 and patterns electrodes and interconnects on one side of central layer 204 before bonding central layer 204 to first device layer 208 and forms recesses 232 and patterns electrodes and interconnects on the other side of central layer 204 after central layer 204 is bonded to first device layer 208. Further, in one implementation, process 200 performs the bonding of central layer 204 to first device layer 208 in a gaseous environment. When the bonding of central layer 204 to first device layer 208 is performed in a gaseous environment, seals 212 and 209 of first device layer 208 hermetically seal the MEMS devices of first device layer 208 in a gaseous atmosphere type.

When fabrication process 200 bonds central layer 204 to first device layer 208 and both surfaces of central layer 204 are patterned and recessed, process 200 bonds a second device layer 210 to central layer 204. Process 200 fabricates second device layer 210 using the same methods described in regards to the fabrication of first device layer 208. When second device layer 210 is bonded to central layer 204, process 200 bonds second outer layer 206 to second device layer 210. In a manner similar to the bonding of central layer 204 to first device layer 210, process 200 bonds second outer layer 206 to second device layer 210 in a gaseous environment so that the MEMS devices in second device layer 210 are sealed in a gaseous atmosphere type. Further the separate devices within first device layer 208 and second device layer 210 are hermetically isolated from each other by seal 213 and hermetically sealed from the external environment by seal 211.

When the multiple layers of the MEMS system are bonded together, process 200 unseals the sections of first device layer 208 and second device layer 210 that include MEMS devices that are intended to operate in a non-gaseous atmosphere type such as a vacuum. For example, as shown in FIG. 2, device 220 in second device layer 210 and device 222 in first device layer 208 are designed to operate in a vacuum. To unseal device 220 and device 222, process 200 forms channels 214 and 215, through microabrasion, drilling, and the like, that extend through first outer layer 202 and central layer 204 to form a continuous cavity that encloses devices 220 and 222 and connects the continuous cavity to the external environment. In some implementations, channels 214 and 215 are formed before first outer layer 202 and second outer layer 206 are bonded to first device layer 208 and second device layer 210. When the external environment is a vacuum, the atmosphere type present in the continuous cavity becomes different than the gaseous atmosphere type surrounding devices 221 and 223. Alternatively, a channel is formed in both first outer layer 202 and second outer layer 206 or in second outer layer 206. When device 220 and 222 are unsealed by the creation of channel 214, MEMS system 100 is placed in a vacuum environment, which environment evacuates the air from within the continuous cavity enclosing devices 220 and 222. In some embodiments, when the air is evacuated from within the continuous cavity, channel 214 is sealed to preserve the vacuum in the continuous cavity. In a further embodiment, a sealing layer 116 as described in FIG. 1 is used to seal channel 214 from the external environment and maintain the vacuum through the use of a getter 118. When channel 214 is sealed, devices 220 and 222 operate in a vacuum and devices 221 and 223 operate in a gaseous environment.

In certain embodiments, a sealing layer is attached to cover the opening of channel 214. The sealing layer is similar to the sealing layer described above in respect to sealing layer 116 in FIG. 1. In some implementations, process 200 fabricates sealing layer 116 from silicon and anodically bonds sealing layer 116 to lower device layer 202. As sealing layer 116 includes a getter 118, when sealing layer 116 is anodically bonded to lower device layer 202, the heat produced during the bonding of sealing layer 116 to lower device layer 202 activates getter 118 such that getter 118 has a refreshed surface in which getter 118 absorbs gas present within the continuous cavity to remove gas from the continuous cavity.

In some implementations, fabrication process 200 is performed on large glass wafers. As such, process 200 creates large batches of MEMS devices that are joined together. To make individual devices, the large wafers are singulated into the individual devices.

Figure 3:
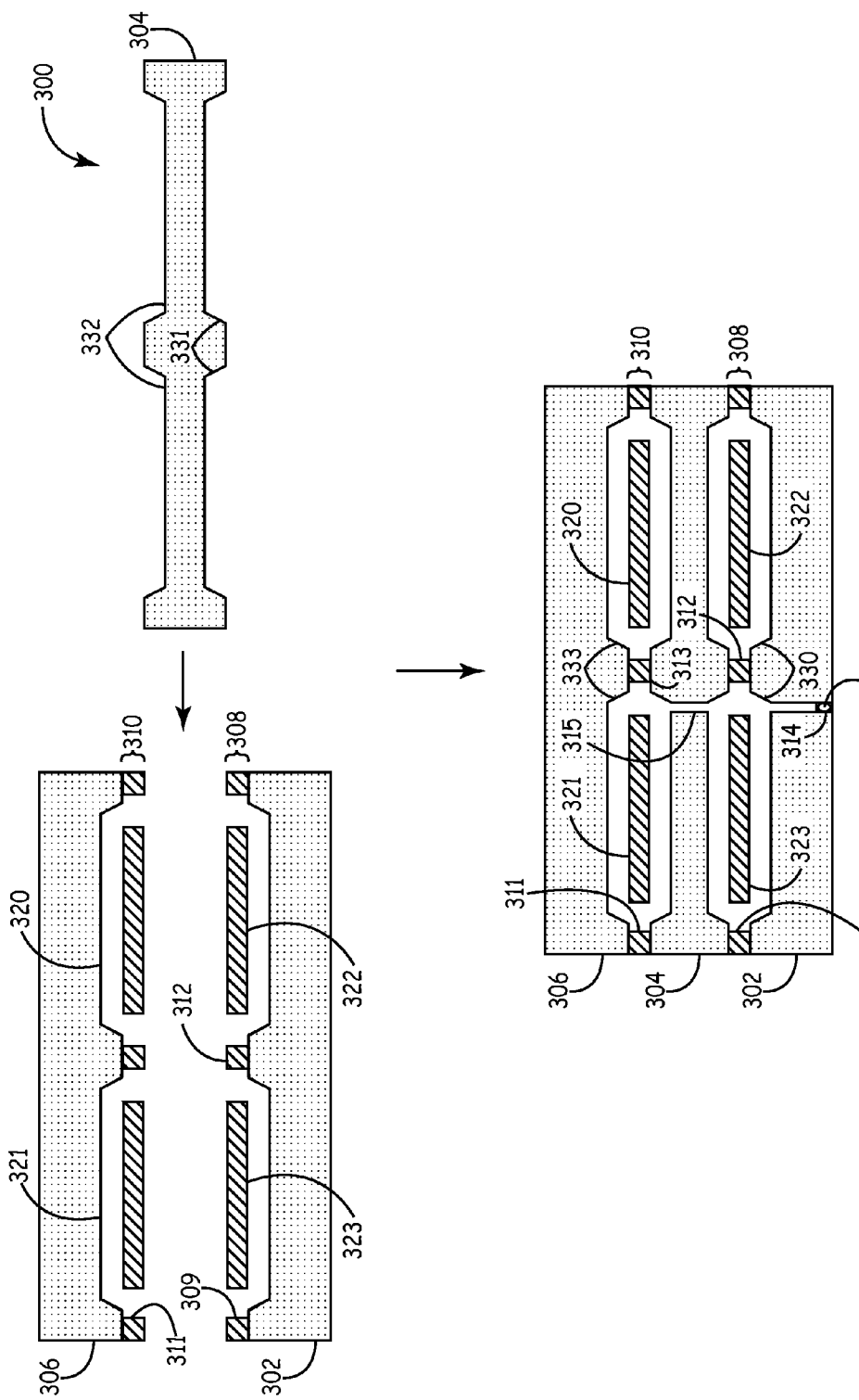
FIG. 3 is a diagram illustrating the fabrication of a three-layer chip-scale MEMS device according to one embodiment.

FIG. 3 is a diagram that illustrates a fabrication process 300 for a three-layer chip-scale MEMS device according to one embodiment. Fabrication process 300 fabricates a first outer layer 302, second outer layer 306, and first device layer 308 as described in regards to first outer layer 202, second outer layer 206, and first device layer 208 in FIG. 2. Fabrication process 300 forms second device layer 310 by creating a silicon substrate and epitaxial layer. The pattern for the devices in second device layer 310 are etched into the epitaxial layer. Then, in contrast to fabrication process 200 where the epitaxial layer was bonded to central layer 304, fabrication process 300 bonds the epitaxial layer to second outer layer 306 using anodic bonding. When the epitaxial layer is bonded to second outer layer 306, the silicon substrate is removed to free the devices for operation. When first device layer 308 is bonded to first outer layer 302 and second device layer 310 is bonded to second outer layer 306, fabrication process 300 fabricates central layer 304 by forming recesses 331, 332, and supportive electrodes and interconnects on both sides of central layer 304. When central layer 304 is formed, fabrication process 300 bonds central layer 304 to both first device layer 308 and second device layer 310.

In certain embodiments, fabrication process 300 bonds central layer 304 to first device layer 308 and second device layer 310 in the presence of a vacuum such that devices 320-323 are all enclosed within a vacuum environment. Alternatively, fabrication process 300 bonds central layer 304 to first device layer 308 and second layer 310 in a gaseous environment such that devices 320-323 are all enclosed within a gaseous environment. However, some devices, such as accelerometers, are designed to operate in a gaseous environment. For example, devices 321 and 323 are designed to operate in a gaseous environment. To enclose devices 321 and 323 in a gaseous environment, process 300 forms channels 314 and 315, through microabrasion, drilling, and the like, that extend through first outer layer 302 and central layer 304 to form a continuous cavity that encloses devices 320 and 322 and connects the continuous cavity to the external environment. When fabrication process 300 creates channels 314 and 315, a continuous cavity encloses devices 321 and 323 while exposing the continuous cavity to the external atmosphere of the MEMS system. When devices 321 and 323, enclosed by the continuous cavity, are exposed to the external atmosphere that is different from the atmosphere type surrounding devices 320 and 322, a plug 327, such as solder, a cap, or a deposited film, seals channel 314 to maintain devices 321 and 323 within the desired atmosphere. For example, when devices 321 and 323 are accelerometers, process 300 forms the channels 314 to expose devices 321 and 323 to a gaseous atmosphere type and then places the plug 327 to seal the continuous air cavity containing a gaseous atmosphere type.

Figure 4A:
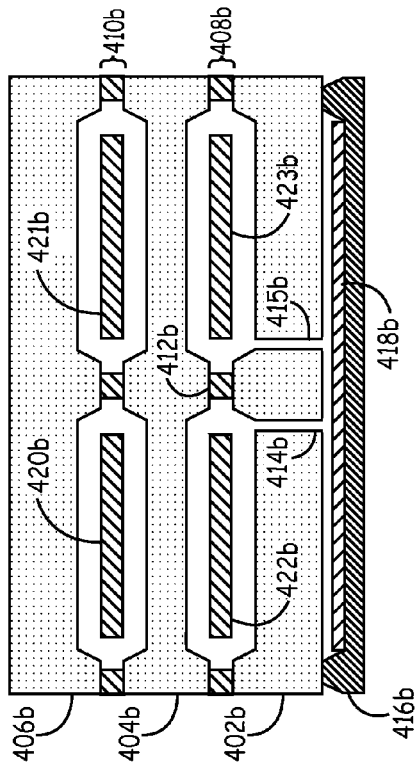
FIGS. 4A-4D are diagrams illustrating different embodiments of cavity configurations in a three-layer MEMS device.

FIGS. 4A-4D are diagrams illustrating different getter and channel configurations in a three-layer MEMS device. FIG. 4A illustrates an embodiment where channels 414a and 415a extend through first outer layer 402a and central layer 404a at different horizontal locations. In contrast, to the embodiment shown in FIGS. 1-3, where the channel through first device layer and central layer were directly above each other, channel 414a in first outer layer 402a is located proximate to the center of first outer layer 402a. In contrast, the channel 415a in the central layer 404a is located proximate to the edge of central layer 404a. While channel 414a is located at a different location in first outer layer 402a than the location in central layer 404a of channel 415a, both channel 414a and channel 415a are part of a continuous cavity that encloses device 420 and 422a and also provides access to a getter 418a in sealing layer 416a.

Figure 4B:
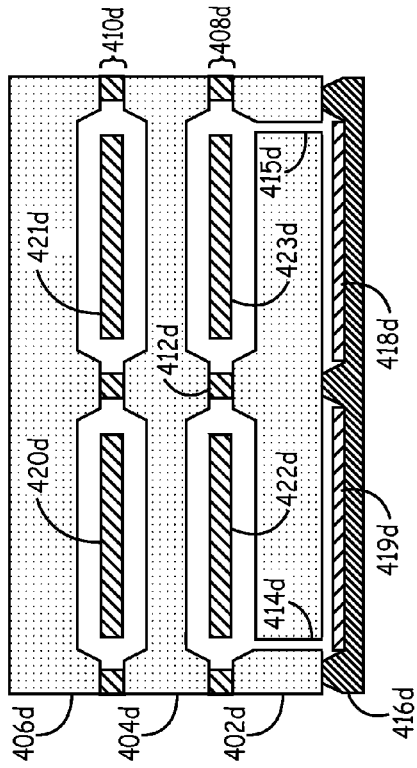

FIG. 4B illustrates an embodiment where first device layer 408b contains a first type of MEMS device and second device layer 410b contains a second type of MEMS device. For example, in some embodiments, when a MEMS system is an ISA, first device layer 408b contains gyroscopes while second device layer 410b contains accelerometers. In some embodiments, a seal 412b hermetically isolates each device in the MEMS system, such that there are no continuous air cavities. When devices of the same type are located in the same device layer 408b or 410b and a seal hermetically isolates the individual devices from one another, separate channels 414b and 415b extend through an outer layer to expose the devices contained in the device layer to an external environment. For example, a fabrication process forms a channel 414b in first outer layer 402b to form a continuous air cavity that encloses device 422b in first device layer 408b. Also, the fabrication process forms a channel 415b in first outer layer 402b to form a continuous air cavity that encloses device 423b in first device layer 408b. In some implementations, both channels 414b and 415b are sealed with a sealing layer 416b that contains a getter 418b, where getter 418b is exposed to the continuous air cavities through channels 414b and 415b.

Figure 4C:
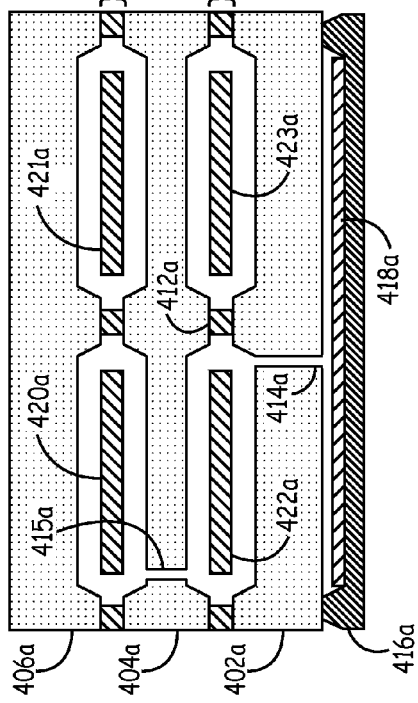

FIG. 4C illustrates an embodiment where first device layer 408c contains a first type of MEMS device and second device layer 410c contains a second type of MEMS device. For example, in some embodiments, when a MEMS system is an ISA, first device layer 408c contains gyroscopes while second device layer 410c contains accelerometers. In some implementations, where a device layer contains a single device type, the devices in a device layer are enclosed by a continuous cavity. For example, devices 422c and 423c are enclosed by a single continuous cavity. When a single continuous cavity encloses all the devices in a device layer, a single channel 414 through an outer layer allows a fabrication process to change the atmosphere type that is contained within the continuous cavity. For example, when the desired atmosphere within the continuous cavity is a vacuum, channel 414c allows any gas present within the continuous cavity to be removed. When the gas is removed, a sealing layer 416c with a getter 418c is bonded to first outer layer 402c to preserve the vacuum within the continuous cavity containing devices 422c and 423c.

Figure 4D:
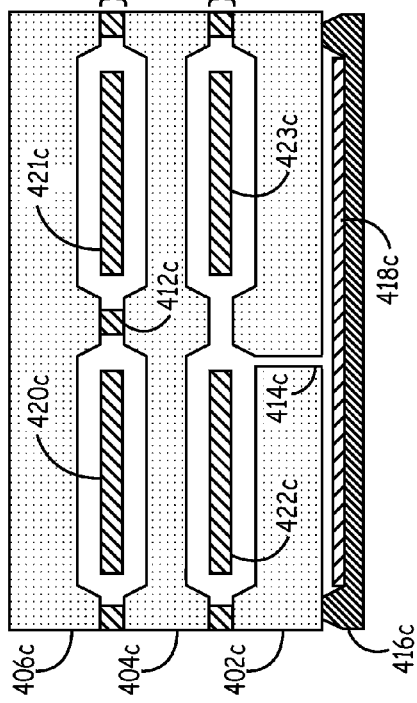

FIG. 4D illustrates an embodiment where multiple channels are used to provide access to multiple getters. In some embodiments each device is hermetically sealed from other devices through seal 412d. Different channels can be located at different locations through either first outer layer 402d or second outer layer 406d. For example, channels 414d and 415d extend through first device layer 402d, where channel 414d forms part of a continuous cavity that encloses device 422d and channel 415d forms part of a continuous cavity that encloses device 423d. Further, channels 414d and 415d expose the respective continuous cavities to different getters 419d and 418d. For example, channel 414d exposes the continuous cavity that encloses device 422d to getter 419d and channel 415d exposes the continuous cavity that enclosed device 423d to getter 418d.

Figure 5:
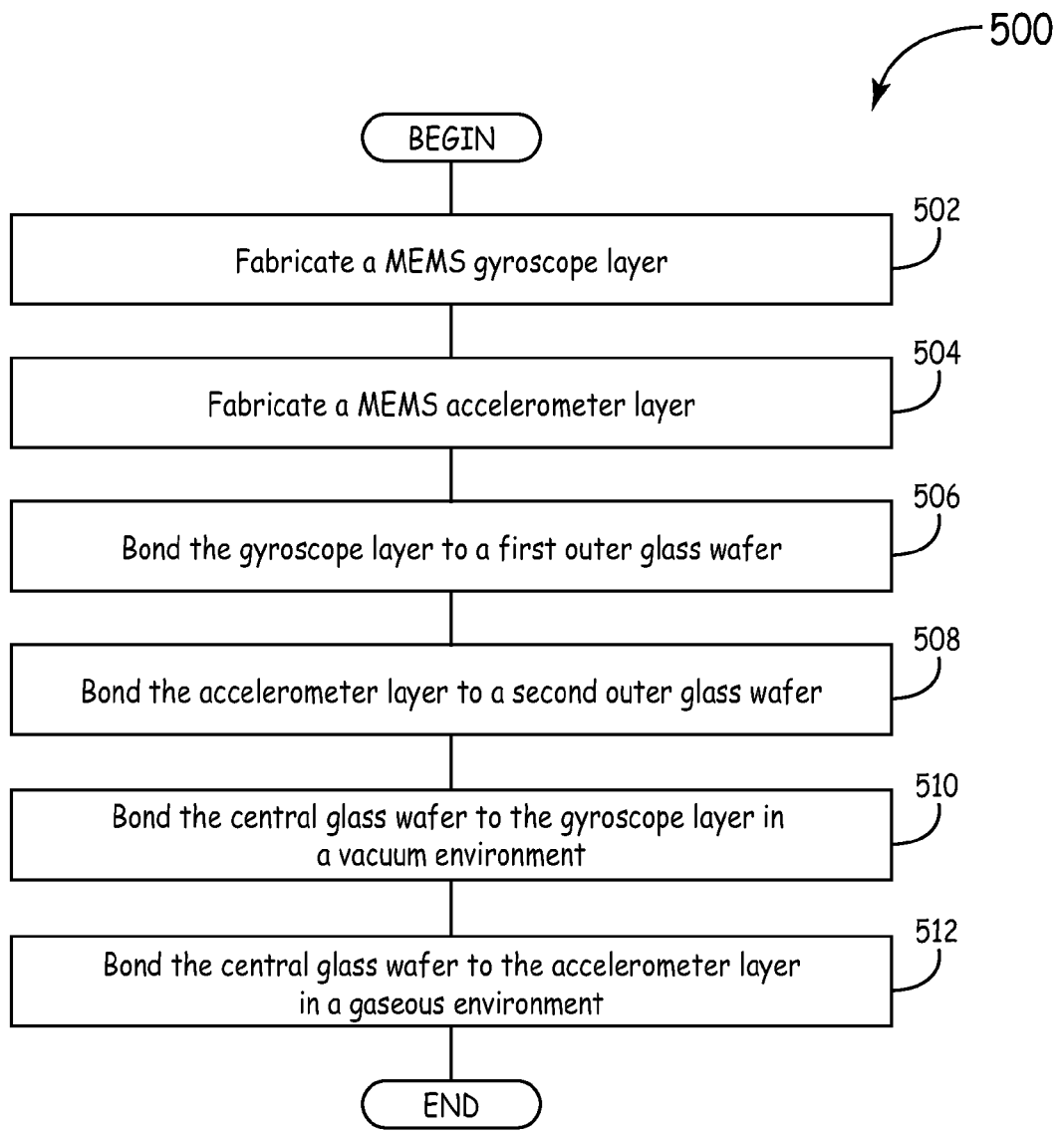
FIG. 5 is a flow diagram of an example method for constructing a three-layer MEMS device according to one embodiment.

FIG. 5 is a flow diagram of an example method 500 for constructing a three-layer IMU according to one embodiment. Method 500 begins at 502 where a MEMS gyroscope layer is fabricated. For example, the fabrication process constructs a first device layer where the devices are comprised of gyroscopes that are designed to operate within a vacuum atmosphere type. The fabrication process creates the MEMS gyroscopes using processes that are understood in the art. For instance, the fabrication process deposits an epitaxial layer on a silicon substrate. When the epitaxial layer is deposited, the fabrication process patterns the MEMS gyroscopes into the epitaxial layer. Further, the gyroscopes in the gyroscope layer are able to sense rotation about three orthogonal axes.

Method 500 proceeds at 504 where a MEMS accelerometer layer is fabricated. For example, the fabrication process constructs a second device layer where the devices are comprised of accelerometers that are designed to operate within a gaseous atmosphere type. The fabrication process creates the MEMS accelerometers using processes that are understood in the art. For instance, the fabrication process deposits an epitaxial layer on a silicon substrate. When the epitaxial layer is deposited, the fabrication process patterns the MEMS accelerometers into the epitaxial layer. Further, the accelerometers in the accelerometer layer are able to sense acceleration along three orthogonal axes.

Method 500 proceeds at 506 where the gyroscope layer is bonded to a first outer glass wafer. For example, the gyroscope layer is bonded to a first outer glass wafer, where recesses, electrodes, and interconnects have been formed in a surface of the first outer glass wafer. The recesses and electrodes and interconnects formed in the surface of the first outer glass wafer support the operation of gyroscopes in the gyroscope layer. In certain embodiments, to bond the gyroscope layer to the first outer glass wafer, the epitaxial layer containing the patterned gyroscopes is anodically bonded to the first outer glass wafer. When the epitaxial layer is bonded to the first outer glass layer, the silicon substrate that supported the epitaxial layer is removed to free the gyroscopes for operation in the MEMS system.

Method 500 proceeds at 508 where the accelerometer layer is bonded to a second outer glass wafer. For example, the accelerometer layer is bonded to a second outer glass wafer, where recesses and electrodes and interconnects have been formed in a surface of the second outer glass wafer. The recesses and electrodes and interconnects formed in the surface of the second outer glass wafer support the operation of the accelerometers in the accelerometer layer. In certain embodiments, to bond the accelerometer layer to the second outer glass wafer, the epitaxial layer containing the patterned accelerometers is anodically bonded to the second outer glass wafer. When the epitaxial layer is bonded to the second outer glass layer, the silicon substrate that supported the epitaxial layer is removed to free the accelerometers for operation in the MEMS system.

Method 500 proceeds at 510 where a central glass wafer is bonded to the gyroscope layer in a vacuum environment. In some embodiments, the gyroscopes are designed to operate in a vacuum environment. To create the vacuum environment within a MEMS system, the central glass wafer is bonded to the gyroscope layer in a vacuum environment. When the central glass wafer bonds to the gyroscope layer, the combination of the first outer glass wafer, which is also bonded to the gyroscope layer, and central glass wafer create sealed cavities around the gyroscopes that preserve a vacuum environment.

Method 500 proceeds at 512 where the central glass wafer is bonded to the accelerometer layer in a gaseous environment. In some embodiments, the accelerometers are designed to operate in a gaseous environment. To create the gaseous environment within a MEMS system, the central glass wafer is bonded to the accelerometer layer in a gaseous environment. When the central glass wafer bonds to the accelerometer layer, the combination of the second outer glass wafer, which is also bonded to the accelerometer layer, and central glass wafer create sealed cavities around the accelerometers that preserve a gaseous environment. Thus, the accelerometers in the accelerometer layer and the gyroscopes in the gyroscope layer are hermetically sealed in their respective environments within a three-layer ISA.

Figure 6:
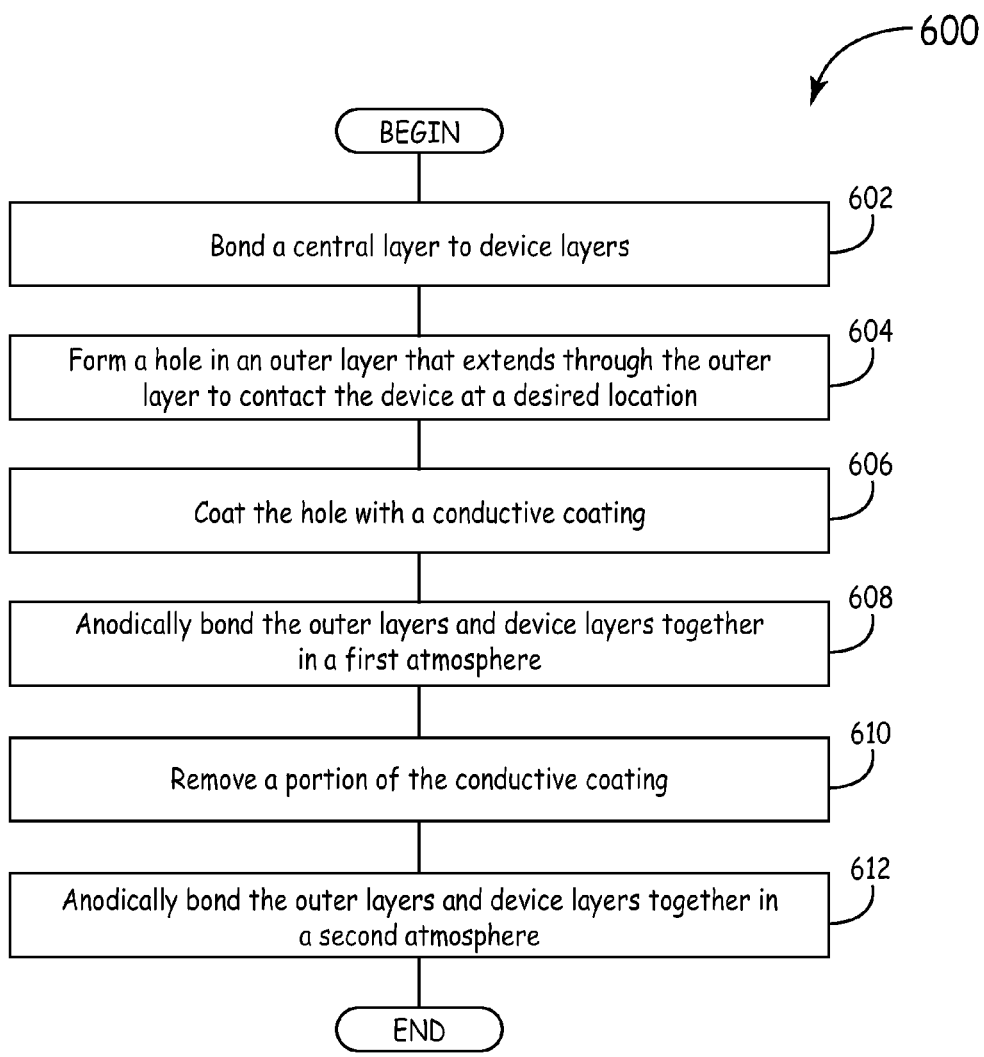
FIG. 6 is a flow diagram of an example method for constructing a three-layer MEMS device according to one embodiment.

FIG. 6 is a flow diagram of an example method 600 for constructing a three-layer MEMS device according to one embodiment. Method 600 begins at 602 where a central layer is bonded to device layers. The epitaxial layers and supportive silicon substrates that are used to fabricate the device layers are substantially fabricated as described above in regards to FIG. 2. In the device layers, the epitaxial layer connected to a supportive silicon substrate is anodically bonded to the central wafer before the supportive silicon substrates are removed.

Method 600 proceeds at 604 where a conduit is formed in an outer layer that extends through the outer layer to contact a device layer at a desired location. Before the device layer is bonded to an outer layer, conduits are created in the outer layer that extend through the outer layers to contact the device layers at desired locations. The desired locations are placed at certain locations that correspond with the location of MEMS devices that operate in a particular atmosphere. For example, where the device layers include a mixture of gyroscopes and accelerometers and the gyroscopes are designed to operate in a vacuum and the accelerometers are designed to operate in a gaseous environment, the desired location of the conduits correspond with the devices that operate in the vacuum or correspond with the devices that operate in the gaseous environment.

Method 600 proceeds at 606 where the conduit is coated with a conductive coating. For example, metal is deposited in the conduits such that one side of the conduit is electrically connected with the other side of the conduit. By depositing electrically conductive material in the conduit the surface of the device layer that comes in contact with the conductive material on an outer layer will be electrically connected with the other side of the outer layer.

Method 600 proceeds at 608 where the outer layers and device layers are anodically bonded together in a first atmosphere. For example, the device layers, which are already bonded to the central layer, are anodically bonded to the outer layers in the presence of a gaseous environment. When the device is bonded, in a gaseous environment, the anodic bonding will seal the devices in the device layers in a gaseous environment unless the device is next to a location that is electrically connected to the external surface of the outer layers. The conduits coated with electrically conductive material prevent bonding of the device layers to the outer layers at the location of the conduits because the electrically conductive material creates a short between the location where the electrically conductive material contacts the device layer and the external surface of an outer layer. The short prevents anodic bonding from sealing the device layer to the outer layer at the location of the conduit, which prevents the formation of a hermetic seal at the location of the conduit. Thus, the location of the conduits prevents some of the devices from being sealed while allowing others to be sealed in a desired atmosphere type. For example, where the location of the conduits corresponds with the location of gyroscopes and the atmosphere type is a gaseous environment, the gyroscopes will remain unsealed after anodic bonding while the other devices in the device layer are sealed in a gaseous environment. Method 600 proceeds at 610 where a portion of the conductive coating is removed. For example, a portion of the conductive coating is removed from within the conduits to disconnect the electrical shorts between the device layer and an external surface of an outer layer. Method 600 then proceeds at 612 where the outer layers and device layers are anodically bonded together in a second atmosphere. For example, when the short is removed and the original anodic bonding was performed in a gaseous environment, the device is placed in a vacuum, and bonded anodically while the device is in the presence of the vacuum. Because the shorts are removed, the anodic bonding will seal the unsealed portions of the device layer in a vacuum. Alternatively, the unsealed portions of the device layer are sealed in the presence of another gaseous environment. Thus, the device layers are sealed to the outer layers and the individual devices are sealed in a desired atmosphere type.

Figure 7:
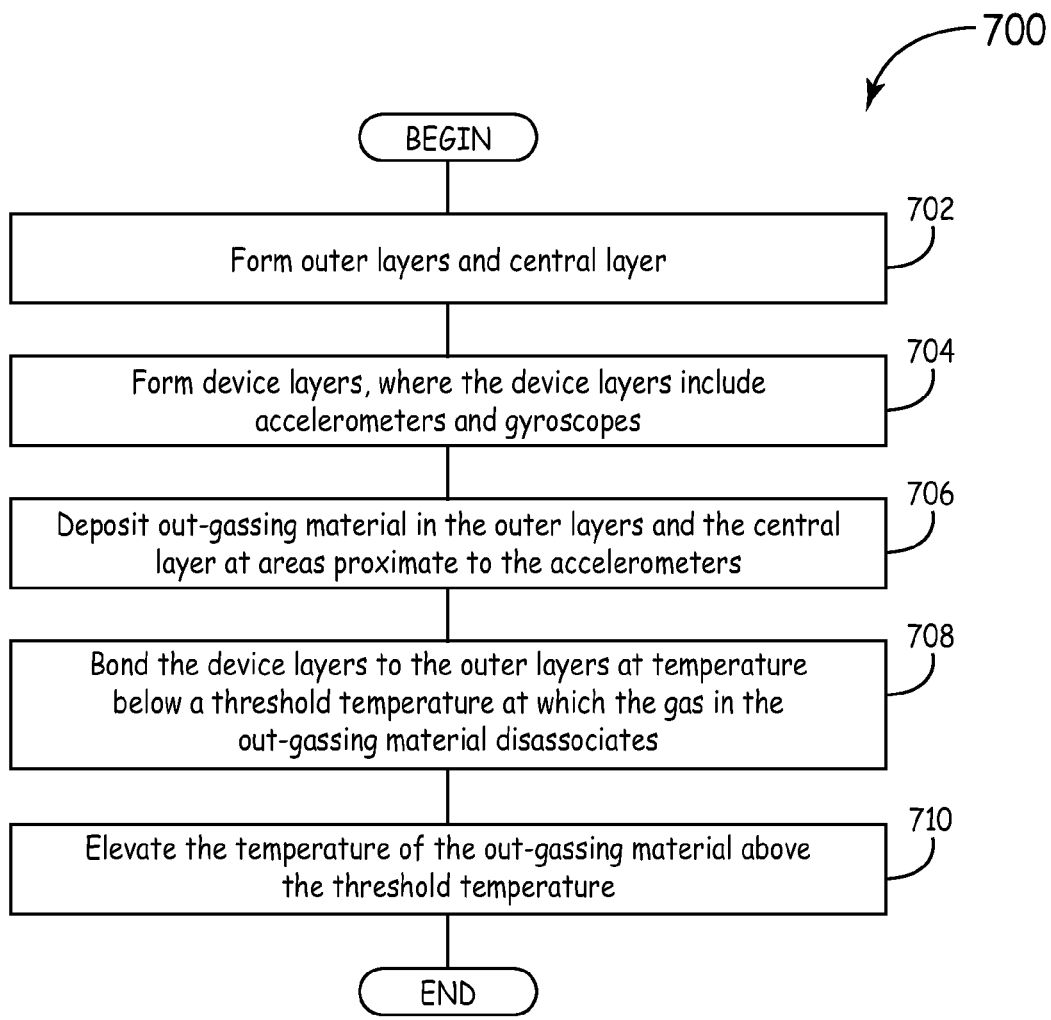
FIG. 7 is a flow diagram of an example method for constructing a three-layer MEMS device according to one embodiment.

FIG. 7 is a flow diagram of an example method 700 for constructing a three-layer MEMS device according to one embodiment. Method 700 begins at 702 where outer layers and a central layer are formed. For example, a fabrication process creates the outer layers and the central layer using substantially the same process described above in regards to the creation of first outer layer 202, central layer 204, and second outer layer 206 as described in FIG. 2. Method 700 proceeds at 704 where device layers are formed, where the device layers include accelerometers and gyroscopes. Similarly, the fabrication process creates the device layers using substantially the same process described above in regards to first device layer 208 and second device layer 210 as described in FIG. 2.

Method 700 proceeds at 706 where out-gassing material is deposited in the outer layers and the central layer at areas designed to be exposed to a cavity containing the accelerometers. The out-gassing material is a substance that disassociates when heated above a certain temperature. For example, metal is deposited in the recessed areas of the outer layers and central layers that correspond to the location of accelerometers in the device layer. When the metal is deposited, the fabrication process infuses the metal with a gas such as argon using ion implantation.

Method 700 proceeds at 708 where the device layers are bonded to the outer layers at a temperature below a threshold temperature at which the gas in the out-gassing material disassociates. For example, the outer layers, central layer, and device layers are bonded to one another as described above in regards to FIG. 2 or 3 but the bonding of the device layers to the central and outer layers is performed at a temperature lower than the threshold temperature at which the gas disassociates from the out-gassing material located next to the accelerometers. Further, the bonding is performed in the presence of a vacuum, such that the devices in the device layers are sealed in vacuum environments.

Method 700 proceeds at 710 where the temperature of the out-gassing material is elevated above the threshold temperature. To change the atmosphere type for certain devices, the temperature of the out-gassing material is raised so that the gas in the out-gassing material disassociates and changes the atmosphere type from a vacuum to a gaseous environment. Thus, the MEMS devices operate within three supportive layers while preserving the devices in the appropriate operational atmosphere.

FIG. 8A-8D are diagrams illustrating different mounting configurations for a three-layer MEMS device according to one embodiment. For example, in some embodiments, when the fabrication process has constructed the MEMS system 800, interconnects are formed along the exterior of the device to allow the device to be mounted on a PCB board or other mounting substrate. In one embodiment, vias extend from the electrical components within the device 800 to connect to the interconnects. The interconnects connect the vias around the exterior surface of the device 800 such that the device can be mounted in multiple orientations. In certain implementations, the vias include electrically conductive silicon that is formed in the glass layers to electrically connect the metal films deposited on the glass layers to the external surface of the MEMS system 800. Alternatively, the vias include metal posts that are placed within channels formed in the glass layer through glass reflow processes. In one embodiment, the interconnects connect to locations on the external surface of the first and second device layer so as to allow electrical connections with the first and second MEMS devices without running through the glass layers.

Figure 8B:
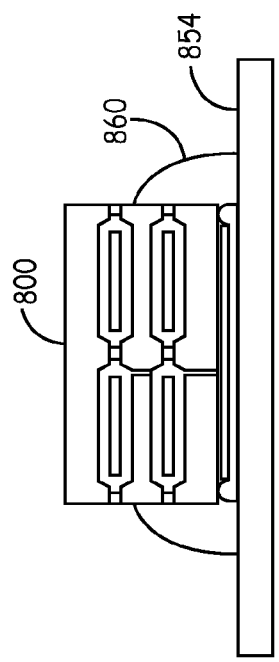
FIG. 8A-8D are diagrams illustrating different embodiments of mounting configurations for a three-layer MEMS device.
Figure 8D:
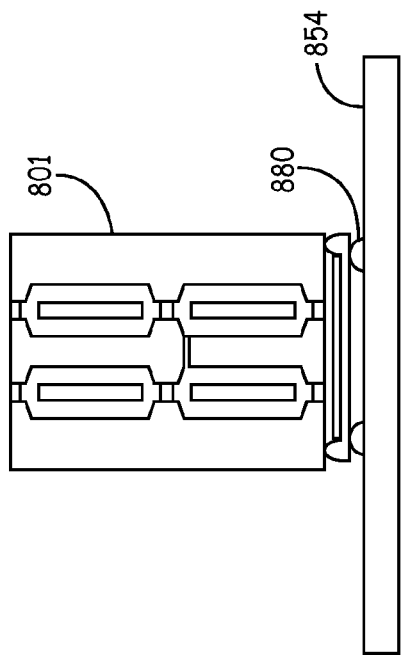
Figure 8A:
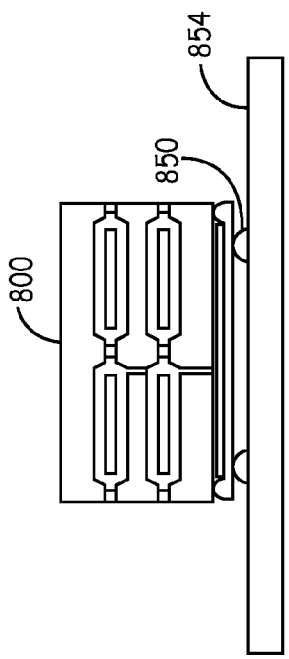

FIG. 8A illustrates a MEMS system 800 mounted on a board 854, where MEMS system 800 is electrically connected to board 854 through bump bonds 850 coupled to electrical contacts on the sealing layer of MEMS system 800. For example, the interconnects on MEMS system 800 extend around MEMS system 800 to the external surface of the sealing layer. Because, the electrical connections are on the same underside of the sealing layer, MEMS system 800 is mounted on bump bonds 850 that electrically connect to MEMS system 800.

FIG. 8B illustrates a MEMS system 800 mounted on a board 854, where MEMS system 800 is electrically connected to board 854 through wire bonds 860 coupled to electrical contacts on the side of MEMS system 800. For example, when the interconnects are on the sides of MEMS system 800, wire bonds 860 extend from board 854 to electrically connect to interconnects located on the sides of MEMS system 800.

Figure 8C:
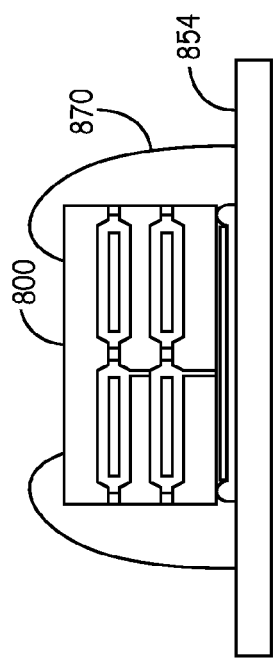

FIG. 8C illustrates a MEMS system 800 mounted on a board 854, where MEMS system 800 is electrically connected to board 854 through wire bonds 870 coupled to electrical contacts on the top surface of MEMS system 800. For example, when the interconnects are on the top surface of MEMS system 800, wire bonds 870 extend from board 854 to electrically connect to interconnects located on the top surface of MEMS system 800.

FIG. 8D illustrates a MEMS system 801 mounted on a board 854, where MEMS system 801 is electrically connected to board 854 through bump bonds 880 coupled to electrical contacts on a sealing layer located on the side of MEMS system 801. For example, the interconnects on MEMS system 801 extend around MEMS system 801 to the external surface of the sealing layer located on a side surface of MEMS system 801. Because, the electrical connections are on the external surface of the sealing layer, MEMS system 801 is mounted on bump bonds 880 that electrically connect to MEMS system 801.

Figure 9:
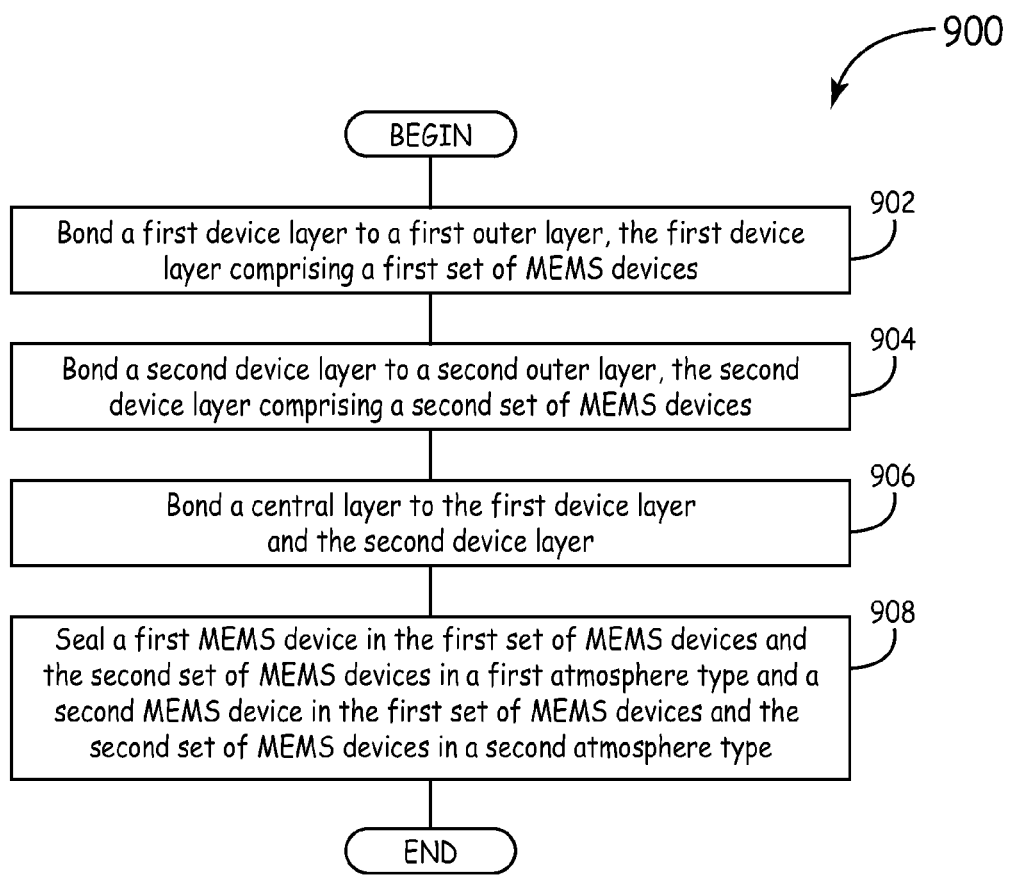
FIG. 9 is a flow diagram of an example method for constructing a three-layer MEMS device according to one embodiment.

FIG. 9 is a flow diagram of an example method 900 for constructing a three-layer MEMS device according to one embodiment. Method 900 begins at 902 where a first device layer is bonded to a first outer layer. For example, a first device layer that includes a first set of gyroscopes and a first set of accelerometers is bonded to a first outer layer. In certain implementations, the first outer layer is anodically bonded to the first device layer.

Further, method 900 proceeds at 904 where a second device layer is bonded to a second outer layer. For example, a second device layer that includes a second set of gyroscopes and a second set of accelerometers is bonded to a second outer layer. In certain implementations, the second outer layer is anodically bonded to the second device layer.

Method 900 proceeds at 906 where a central layer is bonded to the first device layer and the second device layer. Further, method 900 proceeds at 908 where a first MEMS device in the first set of MEMS devices and the second set of MEMS devices is sealed in a first atmosphere type and a second MEMS device in the first set of MEMS devices and the second set of MEMS devices is sealed in a second atmosphere type. For example, when the central layer is bonded to the first device layer and the second device layer, the central layer is bonded to the device layers in a gaseous atmosphere type. To seal other devices in a non-gaseous atmosphere type, like a vacuum, a portion of the MEMS devices are exposed to the non-gaseous atmosphere type. During the exposure to the non-gaseous atmosphere type, the devices are hermetically sealed to preserve the non-gaseous atmosphere type in the environment of the devices.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A micro-electromechanical system (MEMS) device, the device comprising:
   a first outer layer;
   a first device layer comprising a first set of MEMS devices, wherein the first device layer is bonded to the first outer layer;
   a second outer layer;
   a second device layer comprising a second set of MEMS devices, wherein the second device layer is bonded to the second outer layer; and
   a central layer having a first side and a second side opposite that of the first side, wherein the first side is bonded to the first device layer and the second side is bonded to the second device layer, wherein the central layer comprises a continuous material between the first side and the second side.

2. The MEMS device of claim 1, wherein the MEMS device is an inertial sensor assembly (ISA).

3. The MEMS device of claim 1, wherein:
   the first set of MEMS devices comprises a first set of accelerometers and a first set of gyroscopes; and
   the second set of MEMS devices comprises a second set of accelerometers and a second set of gyroscopes.

4. The MEMS device of claim 3, wherein the first set of gyroscopes and the second set of gyroscopes are hermetically sealed in a first atmosphere type and the first set of accelerometers and the second set of accelerometers are hermetically sealed in a second atmosphere type.

5. The MEMS device of claim 4, wherein the first atmosphere type is a vacuum environment.

6. The MEMS device of claim 4, wherein the second atmosphere type is a gaseous environment.

7. The MEMS device of claim 6, further comprising a channel extending from an external surface of the MEMS device to one of the first set of gyroscopes, the second set of gyroscopes, the first set of accelerometers, and the second set of accelerometers.

8. The MEMS device of claim 7, further comprising a sealing layer attached to an external side of the MEMS device, the sealing layer hermetically sealing the channel.

9. The MEMS device of claim 8, wherein the sealing layer includes a getter to preserve a vacuum environment that encloses the first set of gyroscopes.

10. The MEMS device of claim 8, wherein electrical connections extend around the sealing layer such that the MEMS device is mountable in a plurality of different positions.

11. A micro-electromechanical system inertial measurement unit comprising:
   a first outer glass layer;
   a first device layer comprising a first set of accelerometers and a first set of gyroscopes, the first device layer bonded to the first outer glass layer;
   a second outer glass layer;
   a second device layer comprising a second set of accelerometers and a second set of gyroscopes, the second device layer bonded to the second outer glass layer; and a central glass layer having a first side and a second side opposite that of the first side, wherein the first side is bonded to the first device layer and the second side is bonded to the second device layer, wherein the central glass layer comprises a continuous material between the first side and the second side, wherein the first set of accelerometers and the second set of accelerometers are hermetically sealed in a first atmosphere and the first set of gyroscopes and the second set of gyroscopes are hermetically sealed in a second atmosphere, wherein the first set of accelerometers and second set of accelerometers sense acceleration along three orthogonal axes and the first set of gyroscopes and the second set of gyroscopes sense rotation about three orthogonal axes.

\* \* \* \* \*